(12) United States Patent
Strzegowski et al.

(10) Patent No.: US 8,653,166 B2
(45) Date of Patent: Feb. 18, 2014

(54) ENCAPSULANT COMPOSITIONS, METHODS OF MANUFACTURE AND USES THEREOF

(75) Inventors: Luke A. Strzegowski, Easthampton, MA (US); Ryan T. Tucker, Simsbury, CT (US)

(73) Assignee: Arkema France, Colombes (FR)

( * ) Notice: Subject to any disclaimer, the term of this patent is extended or adjusted under 35 U.S.C. 154(b) by 362 days.

(21) Appl. No.: 12/782,851

(22) Filed: May 19, 2010

(65) Prior Publication Data

US 2010/0295091 A1    Nov. 25, 2010

Related U.S. Application Data

(60) Provisional application No. 61/179,479, filed on May 19, 2009.

(51) Int. Cl.
*C08K 5/15*    (2006.01)

(52) U.S. Cl.
USPC ............ 524/114; 524/517; 524/264; 136/251

(58) Field of Classification Search
USPC ......................... 524/517, 264, 114; 136/251
See application file for complete search history.

(56) References Cited

U.S. PATENT DOCUMENTS

| | | | |
|---|---|---|---|
| 5,273,608 | A | 12/1993 | Nath |
| 5,478,402 | A | 12/1995 | Hanoka et al. |
| 5,593,764 | A | 1/1997 | Guerdoux et al. |
| 6,187,448 | B1 | 2/2001 | Hanoka et al. |
| 6,414,236 | B1 | 7/2002 | Kataoka et al. |
| 6,437,046 | B1 | 8/2002 | Morris |
| 6,903,161 | B2 | 6/2005 | Morris |
| 2002/0038664 | A1 | 4/2002 | Zenko et al. |
| 2005/0247402 | A1 | 11/2005 | Fujiki et al. |
| 2006/0201545 | A1 | 9/2006 | Ovshinsky et al. |
| 2007/0213467 | A1 | 9/2007 | Okubo et al. |
| 2010/0269890 | A1 | 10/2010 | Koch et al. |
| 2011/0023943 | A1* | 2/2011 | Prejean ......................... 136/251 |
| 2011/0303263 | A1* | 12/2011 | Corfias-Zuccalli et al. .. 136/251 |

FOREIGN PATENT DOCUMENTS

| | | |
|---|---|---|
| EP | 0721975 A1 | 7/1996 |
| JP | 2006/032308 A | 2/2006 |
| WO | 2010/067039 A1 | 6/2010 |
| WO | 2010/067040 A1 | 6/2010 |

OTHER PUBLICATIONS

International Preliminary Report on Patentability and Writtten Opinion for PCT/US2010/035461 mailed Dec. 1, 2011, 4 pages.
Transmittal of of International Preliminary Report on Patentability for PCT/US2010/035461 mailed Dec. 1, 2011, 1 page.
International Search Report for PCT/2010/035461 mailed Jul. 14, 2010, 6 pages.
Written Opinion of International Search Report for PCT/US2010/035461 mailed Jul. 14, 2010, 4 pages.
Republic of China Search Report; Patent Application No. 201080021653.8; Filing Date: May 19, 2010; Date of Mailing: Nov. 23, 2012; 2 pages.

* cited by examiner

*Primary Examiner* — Peter D Mulcahy
(74) *Attorney, Agent, or Firm* — Thomas F. Roland

(57) ABSTRACT

An encapsulant composition containing about 15 to about 50 wt % of an ethylene/ethyl acrylate/maleic anhydride copolymer containing about 20 to about 40 wt % of an ethylene/glycidyl (meth)acrylate copolymer; about 2 to about 30 wt % of an ethylene/butyl acrylate/maleic anhydride copolymer; about 5 to about 50 wt % of polyethylene, about 0.05 to about 5 wt % of an adhesion promoter; and optionally about 0.01 to about 2 wt % of at least one additive. The composition is useful for encapsulating thin film devices. The disclosure also relates to a method of encapsulating thin film devices with the composition and to devices produced by the method.

15 Claims, No Drawings

ENCAPSULANT COMPOSITIONS, METHODS OF MANUFACTURE AND USES THEREOF

CROSS-REFERENCED TO RELATED APPLICATION

This application claims the benefit of U.S. Provisional Application Ser. No. 61/179,479, filed May 19, 2009, which is incorporated by reference herein in its entirety.

BACKGROUND

1. Field

The disclosure relates to a composition useful in encapsulating thin film devices. The disclosure also relates to a method of encapsulating thin film devices with the composition and to devices produced by the method.

2. Description of the Related Art

Polymeric materials are used in the construction of photovoltaic modules to protect cells, provide electrical isolation, and prevent environmental corrosion. Due to a combination of mechanical properties and attractive price, ethylene vinyl acetate (EVA) polymer-based encapsulants from various suppliers represent a significant majority of the materials used.

One of the long-standing complaints regarding EVA polymers and copolymers is the potential for the generation of corrosive acetic acid upon exposure to atmospheric moisture and/or ultraviolet radiation. This has not proven to be a significant drawback with crystalline silicon cells, and given the low potential percentages of acid generated, coupled with a slow rate of generation, it appears unlikely that acid build-up would be an issue in an construction utilizing a "breathable" back-sheet construction, i.e. Tedlar®/polyester/Tedlar® (TPT) or laminated polyester.

With the rise in silicon prices, however, there has been an increase in the types of non-crystalline devices and the number of modules produces with these technologies. While these devices can offer significant cost savings they are more prone to damage from the environment in the form of moisture and are more sensitive to the potential effects of acetic acid build-up.

Because water alone can be problematic for vapor-deposited devices such as amorphous silicon, most of these constructions rely on a "non-breathable" backside, typically glass. While there is some disagreement within the industry as to the significance of acetic acid, and a large number of modules are produced daily with EVA polymer-based encapsulants, there are also legitimate reasons for concern and the need for a material that eliminates the acid issue is clear. A number of non-EVA encapsulants are in use commercially, such as those based on silicones, polyvinyl butyral (PVB) and ionomeric polymers. Most suffer in some way when compared to EVA, such as in moisture vapor transmission rate (MVTR) or ease of use, and all are significantly more expensive.

Given the importance of increasing the durability of thin-film devices while keeping costs as low as possible, it is desirable to develop a non-EVA based encapsulants that offer the ease of use and low cost found with EVA. It would further be advantageous if the encapsulants provide good moisture protection and/or corrosion protection, particularly when used with vapor deposited modules.

SUMMARY

This disclosure relates to encapsulant compositions for thin film devices. The composition contains an ethylene/ethyl acrylate/maleic anhydride copolymer, an ethylene/glycidyl (meth)acrylate copolymer, an ethylene/butyl acrylate/maleic anhydride copolymer, polyethylene, an adhesion promoter and optionally at least one additive. This disclosure also relates to a method of encapsulating thin film devices with the encapsulate compositions and to devices produced by the encapsulating method.

DETAILED DESCRIPTION

Encapsulant compositions are described herein that contain a specific combination of polymeric components. In particular, it has been found by the inventors hereof that improved moisture and/or corrosion resistance can be obtained using a combination of at least four ethylene-based co-polymeric components. Accordingly, one embodiment includes an encapsulant composition. The composition contains, based on the total weight of the composition:

about 15 to about 50 wt % or about 20 to about 35 wt % or about 25 to about 30 wt % of an ethylene/ethyl acrylate/maleic anhydride copolymer;

about 20 to about 40 wt % or about 22 to about 35 wt % or about 25 to about 30 wt % of an ethylene/glycidyl (meth)acrylate copolymer;

about 2 to about 30 wt % or about 5 to about 20 wt % or about 10 to about 17 wt % of an ethylene/butyl acrylate/maleic anhydride copolymer;

about 5 to about 50 wt % or about 10 to about 40 wt % or about 20 to about 35 wt % of polyethylene;

about 0.05 to about 5 wt % or about 0.1 to about 3 wt % or about 0.3 to about 1 wt % of an adhesion promoter, and optionally, about 0.01 to about 2 or about 0.05 to about 1 wt % of at least one additive.

The ethylene/ethyl acrylate/maleic anhydride copolymer contains, based on the total weight of the units in the copolymer, about 10 to about 25 wt % or about 15 to about 20 wt % ethyl acrylate units and about 1 to about 10 wt % or about 2 to about 5 wt %-maleic anhydride units, with the balance of the units being derived from ethylene.

The ethylene/glycidyl (meth)acrylate copolymer contains, based on the total weight of the copolymer, about 5 to about 15 wt % or about 6 to 10 wt % glycidyl (meth)acrylate units, with the balance of the units being derived from ethylene.

The ethylene/butyl acrylate/maleic anhydride copolymer contains, based on the total weight of the copolymer, about 3 to about 10 wt % or about 5 to 8 wt % butyl acrylate units and about 2 to about 10 wt % or about 3 to about 6 wt % maleic anhydride units, with the balance of the units being derived from ethylene.

The copolymers described above can be produced from the respective monomers by known polymerization techniques such as for example, radical polymerization. Alternatively, representative examples of the copolymers are commercially available. For example, copolymers marketed by Arkema under the Lotader® trademark can be utilized. A specific example of an ethylene/ethyl acrylate/maleic anhydride copolymer is Lotader® 7500. A specific example of an ethylene/glycidyl (meth)acrylate copolymer is Lotader® AX 8840. A specific sample of an ethylene/butyl acrylate/maleic anhydride copolymer is Lotader® 4210.

The copolymers can be random or block copolymers.

The polyethylene used is not particularly limited, except that it must be processable under standard conditions (e.g., on a mill) with the other polymers. Representative polyethylenes include very low density polyethylene (VLDPE), low density polyethylene (LDPE) (including linear low density polyethylene (LLDPE)), high density polyethylene (including very high density polyethylene (VLDPE)) or a combination thereof, again, provided that the polyethylene can be processed with the other polymers, and provide the desired adhesion characteristics. The polyethylene can be produced by known methods, for example using Ziegler-Natta type catalysts or metallocene catalysts. The low density polyethylene has a density of about 0.9 to about 0.95 g/cm$^3$, the very low density polyethylene has a density of less than 0.9 cm/g$^3$, and the high density polyethylene is above 0.95 g/cm$^3$. Representative samples of the polyethylene are commercially available. Specific examples include AT280® marketed by AT Plastics and LD 123®, LD 102® and LD 506® marketed by Exxon.

The adhesion promoter is not limited and can include any type of composition useful in promoting the adhesion of an ethylenic homopolymer and/or copolymer to a substrate. Examples of adhesion promoters include organosilanes containing an olefinic group (e.g., a terminal ethylenically unsaturated group such as a (meth)acryloxy group) or an epoxy group. A specific example of a commercially available organosilane includes 3-methacryloxypropyltrimethoxysilane, available as Dynasylan® Memo marketed by DeGussa (now Evonik), and as Z-6030® from Dow. Other examples of adhesion promoters include epoxy-, acrylate-, and blocked isocyanate-based compositions. A specific example of a commercially available blocked isocyanate-based composition is Nourybond® from Air Products.

The encapsulant composition can optionally contain at least one additive. The additives can include UV stabilizers, UV absorbers, antioxidants, lubricants, fillers, dyes and combinations of any of these. Additives that can scavenge water, acids, and/or bases can also be used in combination with the additives above. The additives are commercially available and can include benzophenone, substituted or hindered amines, substituted or hindered phenols, metal salts of fatty acids, talc, calcium carbonate, clay, titanium, dioxide, carbon black, organophosphates, and organophosphites.

Specific commercial examples of UV stabilizers and absorbers include Tinuvin 770 DF® marketed by CIBA, CYASORB® UV-531 light absorber marketed by Cytec Industries, and LC 770® marketed by Ed-Lynn Network.

The encapsulant composition is formulated by melt processing, e.g., melt extruding the individual components (e.g., copolymers, polyethylene, adhesion promoter and optional additives) using known extrusion techniques. For example, the components are vacuum fed into a weigh bin that is then tumbled to mix the components. The components are fed into an extruder, melt blended in the extruder and extruded out a die into sheet form. A single screw or twin screw extruder can be used. The extruder can have one or more temperature zones along with the length of the extruder with temperatures of about 150 to 350° F. Alternatively, the components can be added sequentially into the extruder at one or more addition points along the length of extruder. Optionally, one or more of the components (e.g., one or more of the additives can be masterbatched and added to the melt initially or at one or more addition points along the extruder. The method is not limited as long as a homogenous melt of the components is achieved.

Another embodiment of the disclosure includes a method of encapsulating a thin film device with the encapsulant composition described above. In general, the method involves placing a thin film device between a first substrate and a second substrate together with the encapsulant composition. The encapsulant composition is often in the form of a thin tape that forms a frame around the edges of the first and second substrates. Any space not occupied by the thin film device or the encapsulant between the two substrates can contain air, nitrogen, argon or any other inert gas or can be evacuated to a pressure of about $1 \times 10^{-12}$ to about 10 Torr.

The thin film device is not limited and can be any useful type of electronic device. For example, the thin film device is at least one selected from a photovoltaic cell, a light emitting diode, an organic light emitting diode and a liquid crystal display.

The first and second substrate is not limited. For some applications at least one of the substrates is transparent or partially transparent to light. The substrates can be selected from glass, plastic, quartz crystal, or combinations of these. The type of glass or plastic is not limited. Plastics include acrylics such as poly(methyl methacrylate) (PMMA) from Arkema, fluoropolymers such as ETFT from Dupont and PVDF from Arkema, polyesters and polyethylene.

The first substrate and second substrate can be sealed together with the encapsulant composition by lamination. The lamination involves placing a sheet of the encapsulant composition between the first substrate and second substrate to form a laminate and heating the laminate to above the melting point of the encapsulant composition. The laminate is then allowed to cool to form a seal between the first substrate and the second substrate. The space not occupied by the thin film device can contain air. Optionally the air can be replaced by nitrogen, argon, or other inert gas or the space can be evacuated to a pressure of $1 \times 10^{-12}$ to 10 Ton during the heating stage of the lamination process. Others processes include an autoclave process with vacuum and no pressure, roll-to-roll and nip roll techniques with heated rolls with pressure and no vacuum.

Another embodiment of the disclosure includes an electronic device produced by the method described above. The electronic device can be a photovoltaic cell, a light emitting diode, an organic light emitting diode or a liquid crystal display. The electronic device can include one or more of each thin film device or a combination of one or more of each thin device. For example, the electronic device can contain a plurality of photovoltaic cells or can contain one or more photovoltaic cells and one or more light emitting diodes.

The following examples are for illustrative purposes only and are not intended to limit the scope of the disclosure.

EXAMPLES

Several encapsulant compositions are prepared and then compared to evaluate the performance of the compositions as encapsulants for thin film devices. The components utilized in the compositions are listed in Table 1.

TABLE 1

| Component | Trade Name |
|---|---|
| Ethylene/ethyl acrylate/maleic anhydride copolymer (80.2/17/2.8 by weight) | Lotader ® 7500 |
| Ethylene/glycidyl (meth)acrylate copolymer (92/8 by weight) | Lotader ® AX 8840 |
| Ethylene/butyl acrylate/maleic anhydride copolymer (89.9/6.5/3.6 by weight) | Lotader ® 4210 |
| Linear low density polyethylene | AT 280 ® |
| Low density polyethylene | Exxon LD 506 ® |
| Low density polyethylene | AT 190 |
| Maleic anhydride grafted low density polyethylene | Dow GR202 |
| Maleic anhydride grafted high density polyethylene | Dow GR204 |
| Ethylene/ethyl acrylate copolymer | Dow Amplify 103 |
| Polyolefin plastomer | Dow Affinity 8183 |

TABLE 1-continued

| Component | Trade Name |
|---|---|
| Metallocene-catalyzed polyethylene | Exxon Exceed 4518PA |
| Very low density polyethylene (VLDPE) | Dow 9042NT |
| Linear low density polyethylene | Exxon LL1001 |
| High density polyethylene | Exxon 6719 |
| 3-Methacryloxypropyltrimethoxysilane (adhesion promoter) | Dynasylan ® Memo |
| 3-Glycidoxypropyltrimethoxysilane (adhesion promoter) | DOW CORNING ® Z-6040 |
| N-2-(Benzylamino)-ethyl-3-aminopropyl-trimethoxysilane (adhesion promoter) | DOW CORNING ® Z-6028 |
| N-β-aminoethyl)-γ-aminopropyl-trimethoxysilane (adhesion promoter) | DOW CORNING ® Z-6020 |
| Vinylbenzylaminoethylaminopropyl-trimethoxysilane (adhesion promoter) | DOW CORNING ® Z-6032 |
| UV Absorber | Cyasorb ® UV-531 |
| UV Stabilizer | Tinuvin ® 770 DF |

The encapsulant compositions are evaluated using a peel adhesion technique and a creep testing technique. The peel adhesion technique measures the bond between the substrate and the encapsulant composition. Peel strengths above 30 lb/in are generally considered acceptable. The creep testing technique qualitatively measures the minimum satisfactory cure level of the encapsulant composition. The method for each technique is described below.

The adhesion test is conducted using a glass plate that has been cleaned with isopropanol and dried with tissue paper. The glass plate is placed on a sheet of release liner and a 1-inch×12-inch piece of an encapsulant composition is placed on the glass aligning left edges and extending the composition lengthwise to the right. A small sheet of release liner is placed across the glass beneath the composition at a distance of ½ inch from the right edge of the glass. A 1-inch× 12-inch section of Tedlar®/polyester/Tedlar® laminate (TPT) is placed on top of the composition and glass with the shiny side facing down. Next a large sheet of release liner is placed on top to cover the entire sample, and the sample is laminated at about 280 to about 320° F. for about 4 to about 20 minutes. The sample is then cooled to mom temperature. After cooling, the glass is placed face down on a cutting board with the TPT/composition portion oriented upward. The test piece is marked at 3 points ½ inch from the edge of the test piece. Two ½ inch strips of TPT/encapsulant composition are cut from top to bottom using a utility knife with any excess composition that can have flowed over the sides of the glass trimmed. The strips are pulled from the top toward the glass until the composition attached to the glass provides resistance. The utility knife is then brushed across the point where the composition melts the glass to loosen the connection. The sample is then placed in a tensometer and the tensile strength (in $lb/in^2$) of the bond between the glass and composition is determined at a crosshead speed of 200 mm per minute. The average peel force is then calculated. Minimum values vary by application and bond strengths between about 20 lb/in to about 80 lb/in are utilized.

The creep test is conducted by suspending a 1-inch×4-inch sheet strip of the composition in an oven with a weight at the bottom of the test strip. The weight is 3 times the weight of the test strip. The strips are marked with marks 2 inches apart and placed in an oven at a selected temperature (90° C., 100° C. and 130° C.) for a period of 10 minutes. Cured strips that maintain the original 2-inch separation between the marks pass and cured strips that elongate beyond the 2 inch separation between the marks fail. The pass/fail criteria are a measure of satisfactory cure of the composition.

Test strip samples for the peel adhesion and creep tests were prepared as follows. The samples were prepared with varying percentages of the polymer components. The four polymer components and adhesion promoter were dry blended into a weigh bin with the selected weight percentages for each. The dry blended components were then melt blended in a single screw extruder and extruded out of a die into sheet form with a thickness of about 0.46 mm. The extruder was operated with temperatures of about 140 to about 310° F. The extruded sheets were then evaluated in the peel adhesion and creep test described above.

Three studies were conducted to determine the effect of polyethylene loading, the effect of the ratio of the ethylene/ethyl acrylate/maleic anhydride copolymer and ethylene/glycidyl (meth)acrylate copolymer and the ethylene/butyl acrylate/maleic anhydride copolymer loading. The polymers utilized are summarized in Table 1. The results are summarized in Tables 2-4.

TABLE 2

Effect of polyethylene loading on peel strength.

| Formula | Lotader 7500 | Lotader 8840 | Lotader 4210 | AT 280 | MEMO | Peel Adhesion |
|---|---|---|---|---|---|---|
| A | 42.0% | 42.0% | 15.5% | 0.0% | 0.5% | Glass broke |
| B | 38.5% | 38.5% | 15.5% | 7.0% | 0.5% | Glass broke |
| C | 35.0% | 35.0% | 15.5% | 14.0% | 0.5% | 80.36 lb/in |
| D | 31.5% | 31.5% | 15.5% | 21.0% | 0.5% | 60.30 lb/in |
| E | 28.0% | 28.0% | 15.5% | 28.0% | 0.5% | 45.32 lb/in |
| F | 24.5% | 24.5% | 15.5% | 35.0% | 0.5% | 40.01 lb/in |
| G | 21.0% | 21.0% | 15.5% | 42.0% | 0.5% | 33.00 lb/in |
| H | 17.5% | 17.5% | 15.5% | 49.0% | 0.5% | 26.73 lb/in |

TABLE 3

Effect of the ratio of ethylene/ethyl acrylate/maleic anhydride copolymer and ethylene/glycidyl (meth)acrylate copolymer on peel adhesion and creep.

| Formula | Lotader 7500 | Lotader 8840 | Lotader 4210 | AT 280 | MEMO | Peel Adhesion | Creep Testing at: 90° C. | 110° C. | 130° C. |
|---|---|---|---|---|---|---|---|---|---|
| E | 28.0% | 28.0% | 15.5% | 28.0% | 0.5% | 45.32 lb/in | Pass | Pass | Pass |
| I | 21.00% | 35.00% | 15.5% | 28.0% | 0.5% | 45.69 lb/in | Pass | Pass | Pass |
| J | 14.00% | 42.00% | 15.5% | 28.0% | 0.5% | 50.71 lb/in | Pass | Fail | Fail |
| K | 7.00% | 49.00% | 15.5% | 28.0% | 0.5% | 57.53 lb/in | Fail | Fail | Fail |
| L | 0.00% | 56.00% | 15.5% | 28.0% | 0.5% | 53.81 lb/in | Fail | Fail | Fail |

TABLE 4

Effect of ethylene/butyl acrylate/maleic anhydride loading on peel adhesion.

| Formula | Lotader 7500 | Lotader 8840 | Lotader 4210 | AT 280 | MEMO | Peel Adhesion |
|---|---|---|---|---|---|---|
| L | 35.50% | 35.50% | 0.00% | 28.50% | 0.50% | 18.98 lb/in |
| M | 33.00% | 33.00% | 5.00% | 28.50% | 0.50% | 30.16 lb/in |
| N | 30.50% | 30.50% | 10.00% | 28.50% | 0.50% | 35.20 lb/in |
| E | 28.00% | 28.00% | 15.50% | 28.00% | 0.50% | 45.32 lb/in |
| O | 25.50% | 25.50% | 20.00% | 28.50% | 0.50% | 50.13 lb/in |

The moisture vapor transmission rate (MVTR) of encapsulant formulation E was compared to commercially available encapsulants (EVA and an ionomeric polymer). The MVTR method is ASTM F-1249-90 and the results are summarized in Table 5. The results show the unexpected improvement in moisture transmission at 23 and 40° C. when using the disclosed encapsulant versus the commercial products. Encapsulant formulation E unexpectedly shows an improvement in moisture transmission two orders of magnitude higher than the more commonly used EVA encapsulant.

TABLE 5

Comparison of moisture vapor transmission rate.

| | MVTR (g/m$^2$/24 hrs) | | |
|---|---|---|---|
| Temperature (° C.) | EVA | Ionomeric polymer | Formulation E |
| 23 | 5.2 | 0.14 | 0.05 |
| 40 | 23.6 | 0.8 | 0.2 |

Further examples were prepared replacing the AT 280 with a variety of different polymers as shown in Table 6. An exemplary formulation contained 28 wt. % Lotader 7500, 28 wt. % Lotader 8840, 5.5 wt. % Lotader 4210, 28 wt % of the polyethylene, and 0.5 wt % of MEMO. Initial Peel strength and peel after exposure to 85% relative humidity at 85° C. (DH) for 500 hours were tested. Results are shown in Table 6.

TABLE 6

Effect of polyethylene polymers

| Formula | Component | Initial Peel | 500 hours DH |
|---|---|---|---|
| P | Exxon LD 506 | 44 lbs/in | 39 lbs/in |
| Q | AT 190 | 34 lbs/in | 30 lbs/in |
| R | Dow GR202 | 69 lbs/in | 0 lbs/in |
| S | Dow GR204 | 81 lbs/in | 0 lbs/in |
| T | Dow Affinity 8185 | 30 lbs/in | 7 lbs/in |
| U | Dow Amplify 103 | Unworkable - too much flow | |
| W | Exxon Exceed 4518PA | Unworkable on mill with Lotader polymers | |
| V | Dow 9042NT | Unworkable on mill with Lotader polymers due to the high processing temperatures required | |
| X | Exxon LL 1001.32 | Unworkable on mill with Lotader polymers due to the high processing temperatures required | |
| Y | Exxon 6719 | Unworkable on mill with Lotader polymers due to the high processing temperatures required | |

The only Formulation with results comparable to the preferred examples contained Exxon LD 506.

Further examples were prepared replacing the MEMO adhesion promoter with a variety of different promoters as shown in Table 6. Each formula contained 28 wt. % Lotader 7500, 28 wt. % Lotader 8840, 15.5 wt. % Lotader 4210, 28 wt % of the polyethylene, and 0.5 wt % of the adhesion promoter. Initial Peel strength and peel after exposure to 85% relative humidity at 85° C. (DH) for 500 hours were tested. Results are shown in Table 7.

TABLE 7

Effect of adhesion promoter

| Formula | Component | Initial Peel | 500 hours DH |
|---|---|---|---|
| AA | Z6040 | 42 lbs/in | 34 lbs/in |
| BB | Z6028 | 25 lbs/in | — |
| CC | Z6020 | 27 lbs/in | — |
| DD | Z6032 | 38 lbs/in | 27 lbs/in |

The adhesion promoters providing the best results were 3-methacryloxypropyltrimethoxysilane and 3-glycidoxypropyltrimethoxysilane.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features. The endpoints of all ranges directed to the same component or property are inclusive of the endpoint and independently combinable.

All publications, patents and patent applications cited in this specification are herein incorporated by reference, and for any and all purposes, as if each individual publication, patent or patent application were specifically indicated to be incorporated by reference. In the case of inconsistencies, the present disclosure will prevail.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the invention and to enable others skilled in the art to utilize the disclosure in such, or other, embodiments and with the various modification required by the particular applications or uses disclosed wherein. Accordingly, the description is not intended to limit the invention to the form disclosed herein. Also, it is intended that the appended claims be construed to include alternative embodiments.

What is claimed is:

1. An encapsulant composition comprising:
   about 15 to about 50 wt % of an ethylene/ethyl acrylate/maleic anhydride copolymer;
   about 20 to about 40 wt % of an ethylene/glycidyl (meth) acrylate copolymer; about 2 to about 30 wt % of an ethylene/butyl acrylate/maleic anhydride copolymer;
   about 5 to about 50 wt % of polyethylene; and
   about 0.05 to about 5 wt % of an adhesion promoter,
   wherein the adhesion promoter is at least one selected from the group consisting of a silane adhesion promoter, an epoxy adhesion promoter, an acrylate adhesion promoter, and a blocked isocyanate adhesion promoter.

2. The encapsulant composition as claimed in claim 1, wherein the ethylene/ethyl acrylate/maleic anhydride copolymer comprises about 10 to about 25 wt % ethyl acrylate units and about 1 to about 10 wt % maleic anhydride units, wherein the ethylene/glycidyl (meth)acrylate copolymer comprises about 5 to about 15 wt % glycidyl (meth)acrylate units and wherein the ethylene/butyl acrylate/maleic anhydride copolymer comprises about 3 to about 10 wt % buty acrylate units and from about 2 to about 10 wt % maleic anhydride units.

3. The encapsulant composition as claimed in claim 1, wherein the copolymers are random copolymers and the polyethylene is a low density polyethylene, wherein the density of the low density polyethylene is about 0.9 to about 0.95 g/cm$^3$.

4. The encapsulant composition as claimed in claim 1, wherein the adhesion promoter comprises an organosilane wherein the organosilane contains an olefinic group having a terminal ethylenically unsaturated group or an epoxy group.

5. The encapsulant composition of claim 1, further comprising about 0.01 to about 2 wt % of at least one additive.

6. A method of encapsulating a thin film device comprising: providing a thin film device;
placing the thin film device between a first substrate and a second substrate; and
sealing the first substrate and the second substrate together with the encapsulant composition as claimed in claim 1 to encapsulate the thin film device.

7. The method as claimed in claim 6, wherein the thin film device is at least one selected from the group consisting of a photovoltaic cell, a light emitting diode, an organic light emitting diode and a liquid crystal display.

8. The method as claimed in claim 6, wherein the first substrate and the second substrate are at least one selected from the group consisting of glass, plastic, and quartz crystal.

9. The method as claimed in claim 6, wherein the first substrate and the second substrate are sealed together with the encapsulant composition by lamination.

10. The method as claimed in claim 9 comprising:
placing the encapsulant composition between the first substrate and second substrate to form a laminate;
applying pressure to the laminate;
heating the laminate to a temperature above the melting point of the encapsulant composition;
cooling the laminate to room temperature to form a seal between the first substrate and second substrate.

11. The method as claimed in claim 10, wherein the space between the substrates not occupied by the thin film device is filled with nitrogen, argon or other inert gas or is evacuated to form a vacuum during the heating of the laminate.

12. An electronic device produced by the method as claimed in claim 6.

13. The electronic device as claimed in claim 12, wherein the thin film device is at least one selected from the group consisting of a photovoltaic cell, a light emitting diode, an organic light emitting diode and a liquid crystal display.

14. The encapsulant composition of claim 1, wherein the adhesion promoter is a silane adhesion promoter and is at least one selected from the group consisting of 3-methacryloxypropyltrimethoxysilane 3-glycidoxypropyltrimethoxysilane, N-2-(benzylamino)-ethyl-3-aminopropyltrimethoxysilane, N-(f3-aminoethyl)-'yaminopropyltrimethoxysilane, and vinylbenzylaminoethylaminopropyltrimethoxysilane.

15. The encapsulant composition as claimed in claim 5, wherein the at least one additive is selected from the group consisting of UV stabilizers, UV absorbers, antioxidants, lubricants, fillers, dyes and combinations thereof.

* * * * *